United States Patent [19]

Aizawa

[11] 4,193,653
[45] Mar. 18, 1980

[54] SOCKET FOR MOUNTING AN ELECTRIC LAMP ON A PRINTED CIRCUIT BOARD

[75] Inventor: Masanobu Aizawa, Yokohama, Japan

[73] Assignee: Stanley Electric Co., Ltd., Tokyo, Japan

[21] Appl. No.: 940,158

[22] Filed: Sep. 6, 1978

[30] Foreign Application Priority Data

Jan. 20, 1978 [JP] Japan ............................. 53-5271[U]
Jan. 20, 1978 [JP] Japan ............................. 53-5272[U]
Jan. 23, 1978 [JP] Japan ............................. 53-6603[U]

[51] Int. Cl.² .......................... H01J 5/50; H05K 1/12
[52] U.S. Cl. ............................ 339/17 D; 339/125 L
[58] Field of Search ............. 339/17 D, 125 L, 127 R, 339/144 R; 313/318

[56] References Cited

U.S. PATENT DOCUMENTS

| | | | |
|---|---|---|---|
| 2,892,992 | 6/1959 | Grovemiller et al. | 339/145 R |
| 3,027,537 | 3/1962 | Hess et al. | 339/191 L |
| 3,511,982 | 5/1970 | Salter | 339/17 D |
| 3,604,919 | 9/1971 | MacPherson | 339/17 D X |
| 3,955,124 | 5/1976 | Jones | 339/17 D X |

*Primary Examiner*—Roy Lake
*Assistant Examiner*—Eugene F. Desmond
*Attorney, Agent, or Firm*—Frishauf, Holtz, Goodman & Woodward

[57] ABSTRACT

The present invention relates to a socket for mounting a small electric lamp having two lead wires extending from a base of the electric lamp, such as a wedge base electric lamp, on a printed circuit board. The socket is so constructed that in mounting the electric lamp, the printed circuit board is firmly held between projections disposed on a drum portion of the socket and a resilient flange portion formed on the bottom end of the drum portion. The lead wires of the lamp are threaded through the socket base and back over the top of the flange portion to contact the printed circuit board.

7 Claims, 7 Drawing Figures

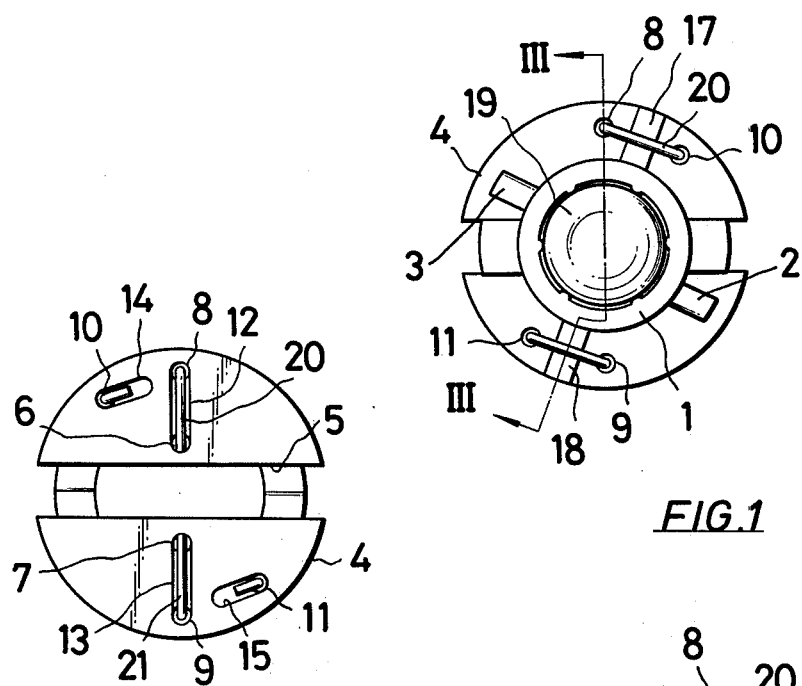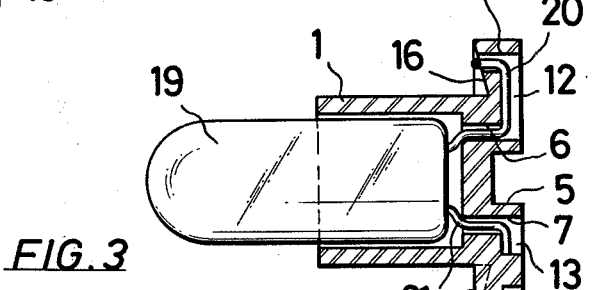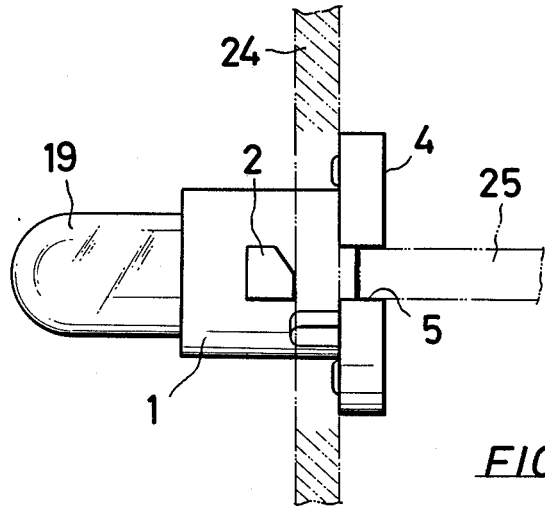

SOCKET FOR MOUNTING AN ELECTRIC LAMP ON A PRINTED CIRCUIT BOARD

BACKGROUND OF THE INVENTION

The present invention relates to a socket for mounting a small electric lamp having two lead wires extended from a base of the electric lamp, such as a wedge base electric lamp, on a printed circuit board.

In general, the socket of the type as described is mounted so as to firmly retain the printed circuit board therein. Therefore, the socket has a drum portion formed with projections, and the printed circuit board is retained between the bottom end portion and the flange portion. The drum portion also serves to retain the electric lamp interiorly therein. There are provided contact terminals with which lead wires of the electric lamp electrically contact, the contact terminal being partly projectingly formed on the flange portion facing the printed circuit board and placed in pressure contact with the contacts on the printed circuit board. Since the contact terminals are provided within the drum portion and the contact terminal is partly placed in pressure contact with the contact of the printed circuit board, the structure becomes complicated. In addition, the provision of the contact terminals causes the length of the drum portion to extend more than necessary, as the terminals must be projecting rearwardly. The conventional device further suffers from the disadvantage in which a knob portion for mounting the printing circuit board greatly projects rearwardly of the printed circuit board, and the use of the printed circuit board or the like used for miniaturization of the device in a limited space has been extremely difficult.

The present invention overcomes these disadvantages noted above by providing an arrangement wherein the structure of the flange portion eliminates the provision of contact terminals; the length of the socket drum portion is reduced and the drum portion is formed integral with the flange portion to minimize rearward projection thereof; the flange portion is formed at the rear surface with grooves and the socket is rotated by a coin, tool or the like to facilitate mounting on the printed circuit board; and the flange portion is formed at the front surface with a taper surface to provide suitable resiliency, thereby eliminating the provision of means by which contact terminal is placed under pressure in contact with the contact of the printed circuit board.

OBJECTS OF THE INVENTION

It is a first object of the present invention to provide a socket for mounting a small electric lamp, the socket of which has a drum portion shorter in length than those of the prior art, the drum portion being integral with a flange portion to minimize rearward projection thereof.

It is a second object of the present invention to provide a socket for mounting an electric lamp on a printed circuit board, which is small and simple in construction, and in which two lead wires extending from a base of the electric lamp are used to serve as contact terminals in contact with contacts on the printed circuit board to thereby eliminate the need for contact terminals within the socket drum portion.

It is a third object of the present invention to provide a socket for mounting an electric lamp on a printed circuit board, in which a flange portion at the bottom end of the socket is formed at the rear surface with grooves into which a coin or tool is fitted to be rotated for mounting the socket to eliminate the need for a conventional mounting knob, to facilitate handling, and to save space at the rear surface of the printed circuit board.

It is a fourth object of the present invention to provide a socket for mounting an electric lamp on a printed circuit board, which is simple in construction, and in which a flange portion of the socket is formed with a tapered surface, and a drum portion and mounting portion are reduced in wall thickness to impart suitable resiliency to the flange portion thereby eliminating the provision of a special device by which contact terminal is placed under pressure in contact with a contact on the printed circuit board.

SUMMARY OF THE INVENTION

The present invention provides a socket for mounting a small electric lamp having two lead wires extending from a base of the electric lamp, such as a wedge base electric lamp, on a printed circuit board. The socket has a drum portion shorter in length than that of the prior art to minimize projection towards the rear surface of the printed circuit board, which is small and simple in construction and which is easy to mount on the printed circuit board.

The socket is mounted so as to hold a printed circuit board between a pair of projections provided on a socket drum portion and a flange portion formed integral with the drum portion at the bottom end portion of the drum. According to one embodiment of the present invention, there is provided an arrangement wherein the flange portion is formed with a plurality of small holes, a plurality of dovetail grooves at the rear surface thereof and projections at the front surface thereof, and two lead wires of the electric lamp are inserted through the small holes and the dovetail grooves and folded back toward the front surface facing to the printed circuit board to be astride the projections, the portions of the lead wires astride the projections serving as contact terminals brought into contact with contacts on the printed circuit board. It is therefore not necessary to provide contact terminals specially on the socket drum portion of the socket as is encountered in the prior art.

The flange portion is formed at the rear surface with grooves so that if a coin or tool is inserted into the groove and rotated, the socket may be easily mounted on the printed circuit board. This eliminates the provision of a mounting knob as in conventional sockets and saves space in the back of the printed circuit board. Also, the construction is simplified.

The flange portion is formed at the front surface with a conical tapered surface, and a mounting portion with respect to the drum portion is made thin in wall thickness to impart a suitable resiliency to the flange portion so that the portions of the lead wires of the electric lamp astride of the projections of the flange are always placed in resilient contact with the contacts on the printed circuit board. With this arrangement, there is required no particular device to maintain the resilient contact as is encountered in prior art sockets.

According to a modified embodiment of the present invention, the flange portion is formed also at the peripheral edge portion with dovetail grooves so that the lead wires taken out from the base of the electric lamp pass through the small holes in the flange portion and the dovetail grooves at the back thereof, after which the lead wires are directed towards the front surface of the flange portion passing through the dovetail grooves in the peripheral edge portion and sit astride of the projection and are again inserted through the small holes. The portions of the lead wires astride of the projections at the front surface of the flange portion serve as the contact terminals which come into contact with contacts on the rear surface of the printed circuit board. In this embodiment, it is not necessary to specially provide contact terminals on the socket drum portion as is encountered in the prior art sockets, similarly to the first embodiment as previously described.

Other objects, advantages and features of the invention, including its details of construction, arrangement of parts, method of operation and economies thereof, will be appreciated from a consideration of the following detailed description when taken in conjunction with the accompanying drawings.

BRIEF DESCRIPTION OF THE DRAWINGS

FIG. 1 is a front view showing one embodiment of a socket for the electric lamp in accordance with the present invention;

FIG. 2 is a rear view of the socket for the electric lamp of FIG. 1;

FIG. 3 is a sectional view taken on line III—III of FIG. 1 showing the socket for an electric lamp;

FIG. 4 is a side view of the socket for the electric lamp shown in FIG. 1;

DETAILED DESCRIPTION OF THE INVENTION

Figure 5:
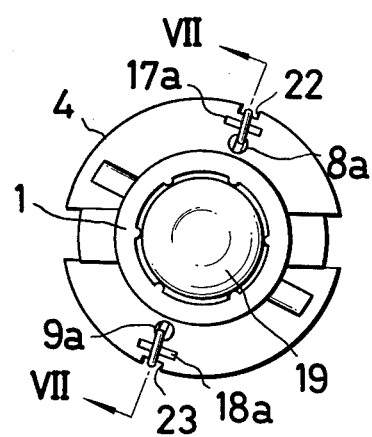
FIG. 5 is a front view showing another embodiment of the socket for an electric lamp in accordance with the present invention.

The present invention relates to a socket for mounting a small electric lamp having two lead wires extending from a base of the electric lamp, such as a wedge base electric lamp, on a printed circuit board, firstly characterized in that in an electric-lamp socket of the construction wherein a printed circuit board is mounted while being held between projections disposed on a drum portion of the socket and a flange portion formed at a bottom end of the drum portion, the flange portion is formed with a plurality of small holes and dovetail grooves at the rear surface or peripheral edge portion thereof, whereby lead wires of the electric lamp are inserted through the small holes and the dovetail grooves and folded back toward the surface facing the printed circuit board to be astride of projections disposed on the side facing the printed circuit board and to be further folded back; secondly characterized in that the flange portion is formed at the rear surface with a groove to receive therein a coin or tool used to turn the socket rightward or leftward when the socket of the present invention is mounted on the printed circuit board; and thirdly characterized in that the flange portion is formed at the surface on the front side thereof with a conical tapered surface inclined toward the portion to be connected to the drum portion in order that a suitable resiliency is imparted to the flange portion to always being portions of the lead wires of the electric lamp astride of the projections of the flange into contact with contacts disposed on the printed circuit board. Accordingly, the lead wires of the electric lamp are locked to the flange portion and are resiliently placed in contact with electrically conductive layers disposed on the printed circuit board. As a result, there is the advantage that contact terminals are not required and in addition, the length of the drum portion can be shortened to minimize the length of the printed circuit board rearwardly extending, thus making it possible to use the device in a limited space.

In the following, the present invention will be further described in detail by way of preferred embodiments shown in the drawings. First, in the first embodiment shown in FIGS. 1-4, a cylindrical drum portion 1, which constitutes a socket, is formed at a peripheral surface substantially in a central portion thereof with a pair of projections 2 and 3 positioned opposite to each other, and a flange portion 4 is formed integral with the drum portion so as to cover one end of the drum portion. The flange portion 4 is formed at the rear surface with a groove 5 so as to cross the central portion thereof. Outside the groove 5 there are provided a plurality of small holes 6, 7, 8, 9, 10 and 11, the small holes 6, 8 and 10, and 7, 9 and 11 being respectively arranged in position symmetrical to one another. The flange portion is formed at the rear surface with dovetail grooves 12 and 13 connecting the small holes 6, 8 and small holes 7, 9, respectively. The small holes 10 and 11 are also continuously formed with short dovetail grooves 14 and 15, which prevent lead wires of an electric lamp later described from being extended rearwardly. A conical-shaped taper 16 is formed on the front side of the flange portion 4, that is, the side facing the printed circuit board. Semi-circular projections 17 and 18 are integrally formed outwardly from the center between the small holes 8, 10 and small holes 9, 11, respectively.

In mounting an electric lamp 19 in the thus formed electric-lamp socket, the electric lamp is inserted through the opening in the drum portion 1, and lead wires 20 and 21 of the electric lamp are inserted through the small holes 6 and 7, respectively to be extended towards the rear surface. The lead wires are then bent outer-peripherally of the flange portion along the dovetail grooves 12 and 13, respectively, and further inserted into the small holes 8 and 9 to appear on the front surface side. The lead wires sit astride of the projections 17 and 18 and are inserted through the small holes 10 and 11 to be extended toward the rear surface, ends of the lead wires being bent in position within the dovetail grooves 14 and 15. As a result, the lead wires 20 and 21 are on the rear surface side fitted into the dovetail grooves 14, 15 so as not to be projected whereas those portions of the lead wires astride of the projections 17 and 18 are on the front surface side projected from the flange portion 4.

The electric-lamp socket of the present invention thus constructed may be mounted by inserting the socket drum portion 1 of the socket into the socket mounting hole made in the printed circuit board 24 and inserting a coin or tool 25 into the groove 5 shown in FIG. 4 to be turned to the right or left to thereby hold the printed circuit board 24 between the projections 2, 3 and the flange portion 4. The lead wires 20 and 21 come into contact with contacts disposed on the rear surface portion of the printed circuit board 24 to energize the electric lamp, and in this case, however, the flange portion 4 is formed at the front surface with the conical tapered surface and a mounting portion with respect to the drum portion 1 is made thin in wall thickness to impart a suitable resiliency thereto. Further, since the lead wires 20 and 21 extending toward the front surface side are placed in contact with the contacts disposed on the rear surface portion of the printed circuit board 24 while maintaining the resilient state, no inoperation of the lamp resulting from inferior contact or flickering resulting from vibrations from the exterior occurs.

Figure 6:
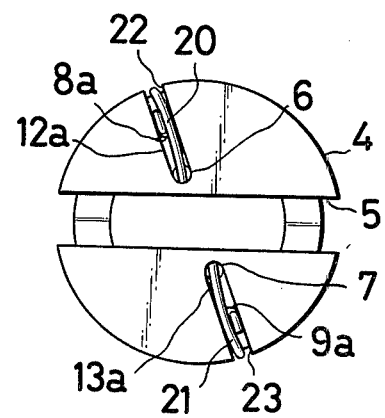
FIG. 6 is a rear view of the socket for the electric lamp shown in FIG. 5.
Figure 7:
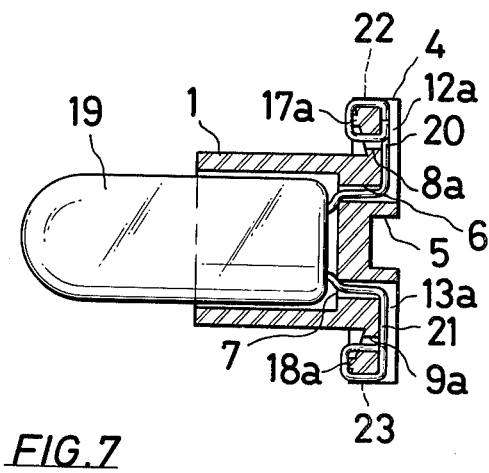
FIG. 7 is a sectional view taken on line VII—VII of FIG. 5 showing the socket for an electric lamp.

In another embodiment shown in FIGS. 5-7, the drum portion of the socket and the tapered surface on the front side and the groove on the rear surface side of the flange portion are identical to those shown in the first-mentioned embodiment, and therefore, further explanation therefor will be omitted while giving like reference numerals to designate like parts. The second embodiment is different from the first embodiment in that small holes disposed in the flange portion 4, dovetail grooves and projections are differently shaped and arranged, that is, the dovetail grooves 12a and 13a connecting the small holes 6 and 7 are made slightly wider extending to the peripheral edge portion, the peripheral edge portion of the flange being further formed with dovetail grooves 22 and 23, adjacent to which projections 17a and 18a are disposed along the circumference on the front side of the flange portion 4. These projections 17a and 18a are respectively internally formed with small holes 8a and 9a open into the dovetail grooves 12a and 13a so that the lead wires 20 and 21 of the electric lamp are inserted into the small holes 6 and 7, bent into the dovetail grooves 12a and 13a, moved toward the front side along the dovetail grooves 22 and 23 in the peripheral edge portion, set astride of the projections 17a and 18a, inserted into the small holes 8a and 9a to be extended toward the rear surface, and the ends of the lead wires then being folded into the dovetail grooves 12a and 13a. Thus, the lead wires 20 and 21 have the portions sat astride of the projections 17a and 18a, respectively, extending from the flange portion 4.

From the foregoing detailed description by way of embodiments, it should be appreciated in the socket for mounting an electric lamp on a printed circuit board in accordance with the present invention that the flange portion is integrally formed at the bottom end portion of the drum portion on which the electric lamp is mounted and hence, in mounting on the printed circuit board, there is less extended rearwardly. Space in the rear surface at the position where the printed circuit board is mounted can be decreased, and at the same time, the device can miniaturized. In addition, since the flange portion of the socket is formed with a plurality of small holes and dovetail grooves, the lead wires of the electric lamp are disposed and fixed along the small holes and the grooves and extended while being astride of the projections on the front side of the flange portion. The projections function as the contact terminals, so it is not necessary to specially provide a separate contact terminal as in the prior art. Moreover, since the flange portion is formed at the rear surface with a groove to receive therein a coin or tool for the purpose of mounting, it is not necessary to provide a mounting knob as is encountered in the prior art, thus facilitating mounting different from those mounting methods employing drilling and screwing. Furthermore, since the front surface of the flange portion is formed into a conical tapered surface and a mounting portion with respect to the drum portion is made thin in wall thickness to provide the suitable resiliency, the contacting state between the lead wires of the electric lamp and the contacts on the printed circuit board may be stably maintained without a provision of the device adapted to provide pressure contact with the contacts on the printed circuit board heretofore employed. As described above, the present invention possesses various good effects.

While certain embodiments of the invention have been described in detail, it is understood that various modifications and other embodiments thereof may be devised by one skilled in the art without departing from the spirit and the scope of the invention, as defined by the claims.

What is claimed is:

1. An electric lamp socket for mounting an electric lamp having a plurality of lead wires on a printed circuit board having electrically conductive sections comprising:
   a cylindrical drum having inner and outer walls and first and second ends, said first end defining a socket to receive said electric lamp, said second end comprising a flange portion having opposing front and rear surfaces, said front surface of said flange portion facing the direction of insertion of said electric lamp into said socket, said flange portion having a plurality of holes therein which extend from said front flange surface to said rear flange surface;
   a plurality of first projections on said front flange surface, each first projection being located between two of said holes extending through said front flange; and
   a plurality of second projections on the outer wall of said cylindrical drum adapted to secure said printed circuit board between said second projections and said flange portion;
   said holes being arranged such that upon insertion of said electric lamp into said socket, each of said plurality of lead wires thereof passes from said front flange surface to said rear flange surface through respective holes of said plurality of holes, said each of said lead wires then running along said rear flange surface and passing through other respective holes leading from said rear flange surface to said front flange surface, said lead wires each then passing over and on said respective first projections on said front flange surface, and then each lead wire being inserted into another of said holes leading from said front flange surface toward said rear flange surface, each of said lead wires then being bent back along said rear surface;
   whereby upon mounting said electric lamp socket to said printed circuit board by securing said printed circuit board between said second projections and said flange portion, said lead wires are each forcibly electrically contacted with respective electrically conductive sections of said printed circuit board.

2. The electric lamp socket according to claim 1 wherein said rear flange surface comprises a plurality of grooves, each of said plurality of grooves communicating with said holes opening on said rear flange surface such that each of said respective lead wire portions running along said rear flange surface may be located in respective grooves.

3. The electric lamp socket according to claim 2 wherein said grooves are dovetail grooves.

4. An electric lamp socket for mounting an electric lamp having a plurality of lead wires on a printed circuit board having electrically conductive sections comprising:

- a cylindrical drum having inner and outer walls and first and second ends, said first end defining a socket to receive said electric lamp, said second end comprising a flange portion having opposing front and rear surfaces, said front surface of said flange portion facing the direction of insertion of said electric lamp into said socket, said flange portion having a plurality of holes therein which extend from said front flange surface to said rear flange surface;
- a plurality of first projections on said front flange surface;
- a plurality of second projections on the outer wall of said cylindrical drum adapted to secure said printed circuit board between said second projections and said flange portion; and
- a plurality of first grooves in the rear flange surface, and a plurality of further grooves connecting said rear flange surface with said front flange surface, said further grooves being connected with respective first grooves;
- said holes and grooves being arranged such that upon insertion of said electric lamp into said socket each of said plurality of lead wires thereof passes from said front flange surface to said rear flange surface through respective holes of said plurality of holes, each of said lead wires then running along said rear flange surface in a respective first groove, each lead wire then extending to said front flange surface via a respective further groove connecting said flange surfaces, said lead wires each then passing over and on said respective first projections on said first flange surface, and then each lead wire being inserted into another of said holes leading from said front flange surface toward said rear flange surface and extending into said first groove where each of said lead wires are bent back in said last-mentioned groove;
- whereby upon mounting said electric lamp socket to said printed circuit board by securing said printed circuit board between said second projections and said flange portion, said lead wires are each forcibly electrically contacted with respective electrically conductive sections of said printed circuit board.

5. The electric lamp socket according to claim 4 wherein said grooves are dovetail grooves.

6. The electric lamp socket according to claims 1 or 4, wherein the rear flange surface further comprises a groove to receive therein a coin or tool to rotate the socket with respect to the printed circuit board for the purpose of mounting the socket on the printed circuit board.

7. The electric lamp socket according to claims 1 or 4, wherein the front flange surface comprises a conically tapered surface and a mounting portion having a thin wall thickness with respect to the drum portion to provide suitable resiliency for mounting said socket on a printed circuit board.

* * * * *